(12) United States Patent
Xu et al.

(10) Patent No.: US 12,272,659 B2
(45) Date of Patent: Apr. 8, 2025

(54) METHODS FOR FORMING METAL GAPFILL WITH LOW RESISTIVITY

(71) Applicant: Applied Materials, Inc., Santa Clara, CA (US)

(72) Inventors: Yi Xu, San Jose, CA (US); Yu Lei, Belmont, CA (US); Zhimin Qi, Fremont, CA (US); Aixi Zhang, Sunnyvale, CA (US); Xianyuan Zhao, Santa Clara, CA (US); Wei Lei, Campbell, CA (US); Xingyao Gao, Sunnyvale, CA (US); Shirish A. Pethe, Cupertino, CA (US); Tao Huang, San Jose, CA (US); Xiang Chang, San Jose, CA (US); Patrick Po-Chun Li, Sunnyvale, CA (US); Geraldine Vasquez, San Jose, CA (US); Dien-yeh Wu, San Jose, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 406 days.

(21) Appl. No.: 17/944,596

(22) Filed: Sep. 14, 2022

(65) Prior Publication Data
US 2024/0088071 A1    Mar. 14, 2024

(51) Int. Cl.
*H01L 23/00*    (2006.01)

(52) U.S. Cl.
CPC .............. *H01L 24/03* (2013.01); *H01L 24/05* (2013.01); *H01L 2224/03452* (2013.01);
(Continued)

(58) Field of Classification Search
CPC ................... H01L 24/03; H01L 24/05; H01L 2224/03452; H01L 2224/03845; H01L 2224/05026; H01L 2224/05082; H01L 2224/05157; H01L 2224/05184; H01L 2924/01027; H01L 2924/01074; H01L 2924/04941; H01L 2924/0496;
(Continued)

(56) References Cited

U.S. PATENT DOCUMENTS

| | | | |
|---|---|---|---|
| 6,342,447 B1 * | 1/2002 | Hoshino | ............. H01L 21/2885 438/653 |
| 8,623,733 B2 | 1/2014 | Chen et al. | |
| 9,129,945 B2 | 9/2015 | Lee et al. | |
| 9,685,371 B2 | 6/2017 | Zope et al. | |

(Continued)

OTHER PUBLICATIONS

PCT International Search Report and Written Opinion for PCT/US2023/032375 dated Jan. 2, 2024.

*Primary Examiner* — Thanh T Nguyen
(74) *Attorney, Agent, or Firm* — Moser Taboada

(57) ABSTRACT

Methods for reducing resistivity of metal gapfill include depositing a conformal layer in an opening of a feature and on a field of a substrate with a first thickness of the conformal layer of approximately 10 microns or less, depositing a non-conformal metal layer directly on the conformal layer at a bottom of the opening and directly on the field using an anisotropic deposition process. A second thickness of the non-conformal metal layer on the field and on the bottom of the feature is approximately 30 microns or greater. And depositing a metal gapfill material in the opening of the feature and on the field where the metal gapfill material completely fills the opening without any voids.

20 Claims, 4 Drawing Sheets

(52) U.S. Cl.
CPC .............. *H01L 2224/03845* (2013.01); *H01L 2224/05026* (2013.01); *H01L 2224/05082* (2013.01); *H01L 2224/05157* (2013.01); *H01L 2224/05184* (2013.01); *H01L 2924/01027* (2013.01); *H01L 2924/01074* (2013.01); *H01L 2924/04941* (2013.01); *H01L 2924/0496* (2013.01); *H01L 2924/059* (2013.01); *H01L 2924/35121* (2013.01)

(58) Field of Classification Search
CPC ..... H01L 2924/059; H01L 2924/35121; H01L 21/28556; H01L 21/76876; H01L 21/2855; H01L 21/76843; H01L 23/53266; H01L 21/76877

See application file for complete search history.

(56) References Cited

U.S. PATENT DOCUMENTS

| | | | |
|---|---|---|---|
| 11,101,174 B2 * | 8/2021 | Jiang | H01L 21/76843 |
| 2001/0053586 A1 | 12/2001 | Lee et al. | |
| 2003/0119325 A1 * | 6/2003 | Jeong | H01L 21/76865 |
| | | | 257/E21.585 |
| 2005/0124153 A1 * | 6/2005 | Cohen | H01L 21/76843 |
| | | | 438/634 |
| 2008/0254617 A1 * | 10/2008 | Adetutu | H01L 23/53238 |
| | | | 438/643 |
| 2012/0056325 A1 | 3/2012 | Yoon et al. | |
| 2012/0077342 A1 * | 3/2012 | Gao | H01L 21/76879 |
| | | | 257/E21.586 |
| 2017/0084486 A1 | 3/2017 | Zope et al. | |
| 2020/0020577 A1 | 1/2020 | Maniscalco et al. | |
| 2022/0020641 A1 | 1/2022 | Chandrashekar et al. | |

* cited by examiner

METHODS FOR FORMING METAL GAPFILL WITH LOW RESISTIVITY

FIELD

Embodiments of the present principles generally relate to semiconductor chambers used in semiconductor processes.

BACKGROUND

When semiconductor devices are manufactured, the devices are formed with contacts to allow electrical connectivity to the device by other devices or for electrical connections external to a chip or circuit. The contacts are made with metal materials that promote electrical conductivity. The higher the conductivity, the less the resistivity. However, the inventors have observed that current manufacturing techniques produce contacts with high resistivity which reduces electrical conductivity and may cause thermal issues due to resistive heating in the contact, resulting in poor performance and reduced reliability.

Thus, the inventors have provided improved methods for forming contacts with low resistivity metal gapfill and increased reliability.

SUMMARY

Methods for forming metal gapfill with low resistivity and high reliability are provided herein.

In some embodiments, a method for reducing resistivity of metal gapfill may comprise depositing a conformal layer in an opening of a feature and on a field of a substrate, wherein a first thickness of the conformal layer is approximately 10 microns or less, depositing a non-conformal metal layer directly on the conformal layer at a bottom of the opening and directly on the field using an anisotropic deposition process, wherein a second thickness of the non-conformal metal layer on the field and on the bottom of the feature is approximately 30 microns or greater, and depositing a metal gapfill material in the opening of the feature and on the field, wherein the metal gapfill material completely fills the opening without any voids.

In some embodiments, the method may further comprise depositing the conformal layer using an atomic layer deposition (ALD) process, depositing the non-conformal metal layer using a plasma vapor deposition (PVD) process, and depositing the metal gapfill material using a chemical vapor deposition (CVD) process; wherein the first thickness is approximately 3 microns to approximately 8 microns; wherein the second thickness is approximately 40 microns; wherein the first thickness and the second thickness combined is at least approximately 40 microns; wherein the conformal layer is titanium nitride, tungsten nitride, or tungsten carbon nitride; wherein the non-conformal metal layer is tungsten or cobalt; wherein the metal gapfill material is tungsten or cobalt; wherein the feature is a contact for a logic device; wherein the conformal layer is at least one monolayer in thickness; and/or the method performed in an integrated tool.

In some embodiments, a method for reducing resistivity of metal gapfill may comprise depositing a titanium nitride conformal layer in an opening of a feature and on a field of a substrate using an atomic layer deposition (ALD) process, wherein a first thickness of the titanium nitride conformal layer is approximately 10 microns or less, depositing a tungsten non-conformal layer directly on the titanium nitride conformal layer at a bottom of the opening and directly on the field using a plasma vapor deposition (PVD) process, wherein a second thickness of the tungsten non-conformal layer on the field and on the bottom of the feature is approximately 30 microns to approximately 50 microns, and depositing a tungsten gapfill material in the opening of the feature and on the field using a chemical vapor deposition (CVD) process, wherein the tungsten gapfill material completely fills the opening without any voids.

In some embodiments, the method may further include wherein the first thickness is approximately 3 microns to approximately 8 microns, wherein the second thickness is approximately 40 microns, wherein the first thickness and the second thickness combined is at least approximately 40 microns, wherein the feature is a contact for a logic device, wherein the titanium nitride conformal layer is at least one monolayer in thickness, and/or the method being performed in an integrated tool.

In some embodiments, a non-transitory, computer readable medium having instructions stored thereon that, when executed, cause a method for reducing resistivity of metal gapfill to be performed, the method may comprise depositing a conformal layer in an opening of a feature and on a field of a substrate, wherein a first thickness of the conformal layer is approximately 10 microns or less, depositing a non-conformal metal layer directly on the conformal layer at a bottom of the opening and directly on the field using an anisotropic deposition process, wherein a second thickness of the non-conformal metal layer on the field and on the bottom of the feature is approximately 30 microns to approximately 50 microns, and depositing a metal gapfill material in the opening of the feature and on the field, wherein the metal gapfill material completely fills the opening without any voids.

In some embodiments, the method of the non-transitory, computer readable medium may further include depositing the conformal layer using an atomic layer deposition (ALD) process, depositing the non-conformal metal layer using a plasma vapor deposition (PVD) process, and depositing the metal gapfill material using a chemical vapor deposition (CVD) process.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
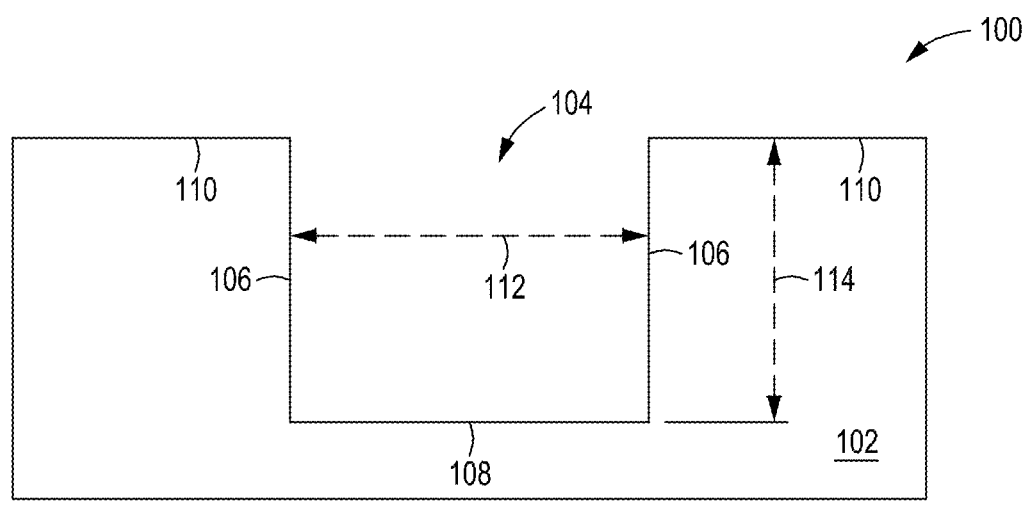
FIG. 1 depicts a cross-sectional view of a feature formed in a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide low resistivity contacts with maximized gapfill volume and enhanced adhesion properties to better resist chemical mechanical polishing (CMP) forces. The techniques combine a thin conformal liner layer (e.g., TiN, WN, etc.) and a plasma vapor deposition (PVD) metal (e.g., W, etc.) layer as a liner for a metal gapfill material (e.g., chemical vapor deposition (CVD) W, etc.) to satisfy both CMP/adhesion requirements and also to satisfy gapfill requirements, providing a low resistivity metal gapfill solution with enhanced parameters. The reduced thickness of the conformal liner decreases the resistivity of the contact. The conformal liner layer provides a continuous sidewall liner for the feature during CVD metal gapfill processes with low incubation and good growth in the feature to prevent void formation, improving the gapfill process. The non-conformal PVD metal layer, along with the conformal liner layer, provides enough thickness on the field of the substrate to meet adhesion requirements for CMP. The combined thin conformal liner layer and the PVD metal layer have a reduced thickness inside of the feature over conventional processes such that the gapfill volume of a feature is increased, further reducing the contact resistance and improving the gapfill performance. In addition, the combination of the conformal liner layer and the non-conformal PVD metal layer provide an adhesion cap on the field of the substrate to improve the CMP process. The methods may be used to form contacts in features used in logic devices and the like.

Figure 2:
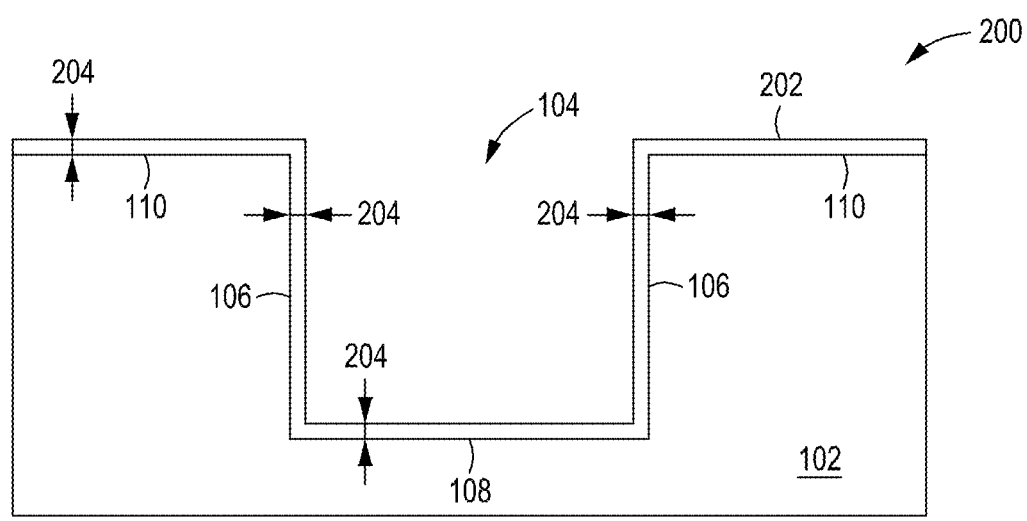
FIG. 2 depicts a cross-sectional view of a conformal layer deposited on the feature and the substrate in accordance with some embodiments of the present principles.
Figure 4:
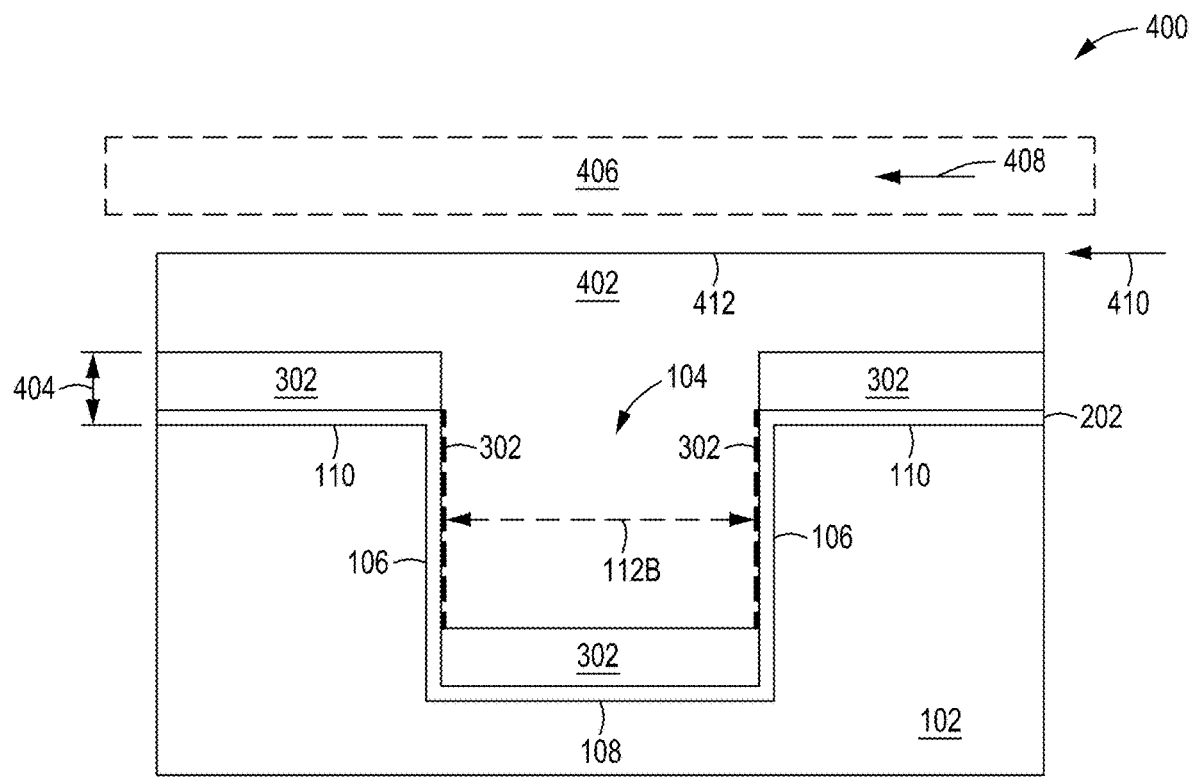
FIG. 4 depicts a cross-sectional view of a metal gapfill material deposited on the feature and the substrate in accordance with some embodiments of the present principles.
Figure 5:
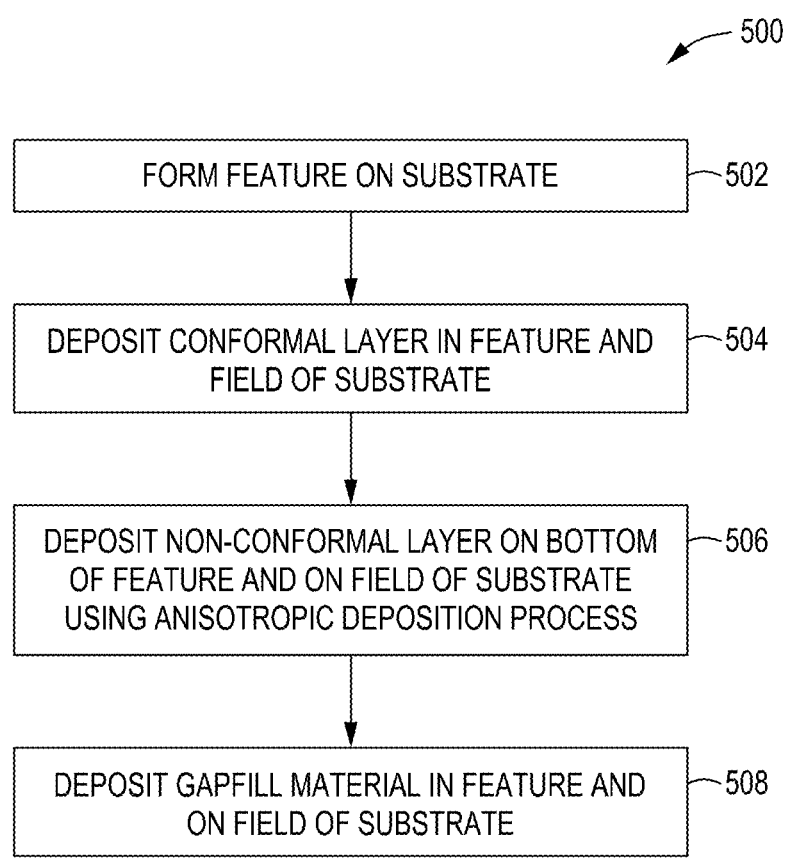
FIG. 5 is a method of depositing a metal gapfill material having low resistivity in accordance with some embodiments of the present principles.

In FIG. 5, a method 500 of depositing a metal gapfill material having low resistivity in accordance with some embodiments is depicted. References are made to FIGS. 1-4 during the discussion of the method 500. In block 502, a feature 104 has sides 106 and a bottom 108 and is formed on a substrate 102 as depicted in a view 100 of FIG. 1. The representative feature in the example is an opening in a field 110 of the substrate 102. The feature 104 has a height 114 and a width 112. In order to provide the maximum volume for a gapfill material, the ratio of the height 114 to the width 112 or aspect ratio of the feature 104 should be maintained as close as possible. The method 500, as described herein, provides for close to maximum volume by minimizing any impact on the aspect ratio of the feature 104. In block 504, a conformal layer 202 is deposited in the feature 104 and on the field 110 of the substrate 102 as depicted in a view 200 of FIG. 2. The conformal layer 202 has a thickness 204 that is approximately the same on the field 110 of the substrate 102, on the sides 106 of the feature 104, and on the bottom 108 of the feature 104. In some embodiments, the thickness 204 may be approximately 10 microns or less. In some embodiments, the thickness 204 may be approximately 3 microns to approximately 8 microns. In some embodiments, the thickness 204 may have a thickness of one or more monolayers of deposited material of the conformal layer 202. The thickness of the monolayer determines the minimum thickness of the conformal layer 202. The thinner the conformal layer 202, the lower the resistivity of the conformal layer 202. The conformal layer 202 should be continuous on the field 110 and in the feature 104.

In some embodiments, the conformal layer 202 may be deposited using an atomic layer deposition (ALD) process. The conformal layer 202 may be, but not limited to, titanium nitride, tungsten nitride, and/or tungsten carbon nitride and the like. The materials used for the conformal layer 202 are generally oxides that have high resistivity which decreases the conductivity of a contact. By using a thin layer (i.e., less than approximately 10 microns), the resistivity of the conformal layer 202 is dramatically reduced. Metal depositions such as PVD tungsten and CVD tungsten have a resistivity of approximately 15 ohm-cm or less. Whereas titanium nitride has a resistivity of approximately 200 to 500 ohm-cm. Reduction of the thickness of the conformal layer 202 has a dramatic effect on the contact resistivity. The conformal layer 202 serves to provide adhesion for CMP processing of the gapfill material and to promote gapfill material growth during gapfill processes. The low incubation period of the conformal layer 202 promotes gapfill growth on the sides 106 of the feature 104 while the gapfill growth on the bottom 108 of the feature is promoted by the non-conformal layer (discussed below). In some traditional approaches, long incubation periods occur on the sides of the feature causing voids to form inside of the gapfill material, dramatically reducing the performance of the contact and, thus, yields. The conformal layer 202 of the present methods provides a solution to the issues found in traditional approaches.

Figure 3:
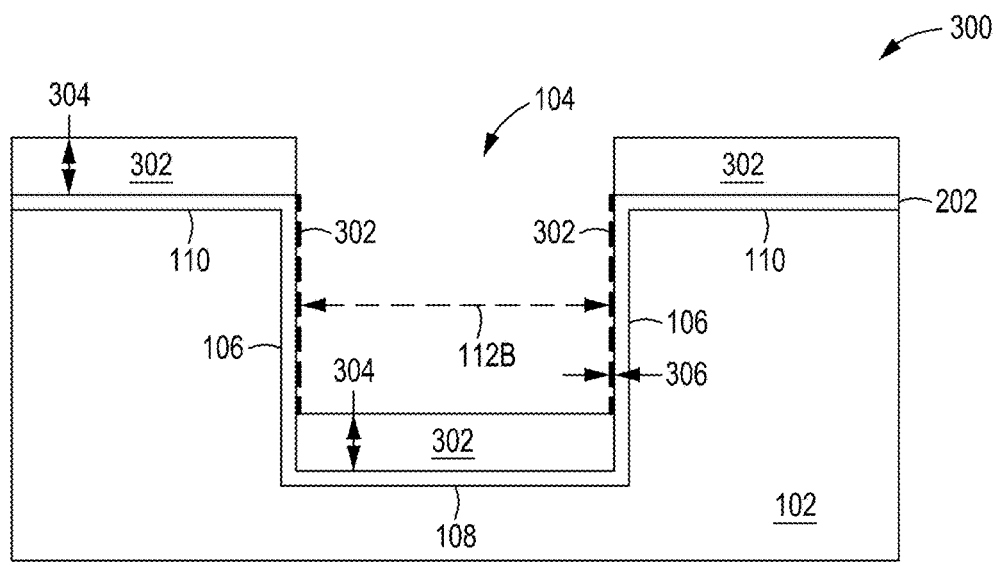
FIG. 3 depicts a cross-sectional view of a non-conformal layer deposited on the feature and the substrate in accordance with some embodiments of the present principles.

In block 506, a non-conformal layer 302 is deposited on the bottom 108 of the feature 104 and on the field 110 of the substrate 102 using an anisotropic deposition process as depicted in a view 300 of FIG. 3. Because the deposition process is directional, a first thickness 304 of the non-conformal layer 302 is approximately the same on the field 110 of the substrate 102 and on the bottom 108 of the feature 104. In some embodiments, the first thickness 304 may be approximately 30 microns to approximately 50 microns. In some embodiments, the first thickness 304 may be approximately 30 microns to approximately 40 microns. In some embodiments, the first thickness 304 may be approximately 32 microns to approximately 37 microns. A second thickness 306 of the non-conformal layer 302 on the sides 106 of the feature 104 is negligible (and may be discontinuous) due to the directionality of the deposition process.

In some embodiments, the non-conformal layer 302 may be deposited using a PVD process and the like. In some embodiments, the PVD process is self-biasing to provide the anisotropic deposition of the non-conformal layer 302. In some embodiments, the PVD process may use an applied bias to the substrate to further influence the PVD deposition. The non-conformal layer 302 forms on the conformal layer 202 on the field 110 of the substrate 102 and on the conformal layer 202 at the bottom 108 of the feature 104. Any deposition of the non-conformal layer 302 on the conformal layer 202 on the sides 106 of the feature 104 may be discontinuous and is negligible in thickness. In some embodiments, the non-conformal layer 302 is formed of a metallic material such as, but not limited to, tungsten and/or cobalt and the like. The material of the non-conformal layer 302 is selected to promote growth of a selected gapfill material. The non-conformal layer 302 serves to promote not only the growth of the gapfill material in the feature 104, but also to meet adhesion requirements during CMP processes on the field 110 of the substrate 102.

In block 508, a gapfill material 402 is deposited in the feature 104 and on the field 110 of the substrate 102 as depicted in a view 400 of FIG. 4. In some embodiments, the gapfill material 402 may be, but not limited to, tungsten and/or cobalt and the like. In some embodiments, the gapfill material 402 is deposited using a chemical vapor deposition (CVD) process. The incubation period of the conformal layer 202 and the non-conformal layer 302 are similar, allowing growth on the bottom 108 and the sides 106 to occur without causing voids (empty space) to form inside of the gapfill material 402. Because of the thinness of the conformal layer 202 and the low deposition thickness characteristics of the non-conformal layer 302 on the sides 106 of the feature 104, the resulting width 112B of the feature 104 is within 20 microns or less of the width 112 of the original feature (see, FIG. 1), maintaining the low aspect ratio of the feature 104 (as opposed to when the width of the feature is reduced and the aspect ratio increases to a higher level). The maximized width of the feature 104 allows for a maximum volume of gapfill material 402 inside of the feature 104, increasing the conductivity (decreasing the resistivity) of the contact due to the increased volume. In some embodiments, the method 500 can produce contacts with 50% or more volume of gapfill material than with traditional processes.

The inventors have found that CVD gapfill materials have high internal stress and to avoid peeling, the underlying layer thickness should meet a minimum thickness requirement of at least approximately 40 microns. The combined thickness 404 of the conformal layer 202 and the non-conformal layer 302 meets the adhesion requirement needed to prevent peeling of the gapfill material 402 during CMP processes. For example, a CMP pad 406 is pressed down on a surface 412 of the gapfill material 402 as the CMP pad 406 is rotating 408. The rotation causes a shearing force 410 to be applied across the surface 412 of the gapfill material 402. If the adhesion force holding the gapfill material 402 to the field 110 of the substrate 102 is not sufficient, the gapfill material 402 will begin to peel off of the field 110 of the substrate 102 causing possible damage to the substrate 102 and the feature 104. In some embodiments, the combined thickness 404 on the field 110 of the substrate is at least approximately 40 microns in order to meet adhesion requirements of the gapfill material 402 during CMP processes. In some embodiments, the thickness 204 of the conformal layer 202 is approximately 5 microns and the thickness of the non-conformal layer is approximately 35 microns. Overall, the contacts produced by the method 500 have lower resistivity (larger gapfill volume and thinner oxide layers), higher yields (no voids), and increased performance.

Figure 6:
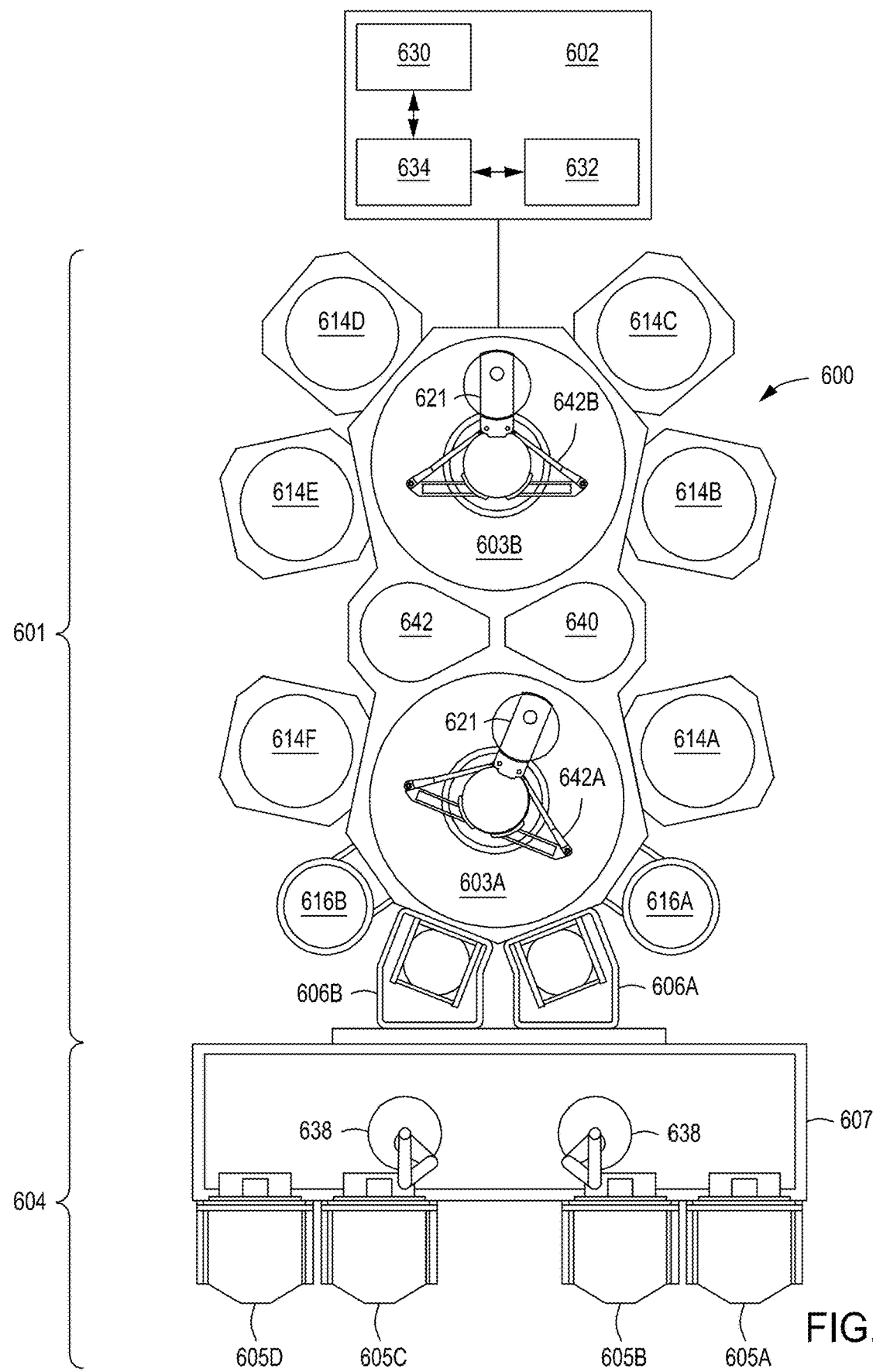
FIG. 6 depicts an integrated tool in accordance with some embodiments of the present principles.

The methods described herein may be performed in individual process chambers that may be provided in a standalone configuration or as part of a cluster tool, for example, the integrated tool 600 (i.e., cluster tool) described below with respect to FIG. 6. The advantage of using an integrated tool 600 is that there is no vacuum break between chambers and, therefore, no requirement to degas and pre-clean a substrate before treatment in a chamber. For example, in some embodiments the inventive methods discussed above may advantageously be performed in an integrated tool such that there are limited or no vacuum breaks between processes, limiting or preventing contamination of the substrate such as oxidation and the like. The integrated tool 600 includes a vacuum-tight processing platform 601, a factory interface 604, and a system controller 602. The processing platform 601 comprises multiple processing chambers, such as 614A, 613B, 614C, 614D, 614E, and 614F operatively coupled to a vacuum substrate transfer chamber (transfer chambers 603A, 603B). The factory interface 604 is operatively coupled to the transfer chamber 603A by one or more load lock chambers (two load lock chambers, such as 606A and 606B shown in FIG. 6).

In some embodiments, the factory interface 604 comprises at least one docking station 607, at least one factory interface robot 638 to facilitate the transfer of the semiconductor substrates. The docking station 607 is configured to accept one or more front opening unified pod (FOUP). Four FOUPS, such as 605A, 605B, 605C, and 605D are shown in the embodiment of FIG. 6. The factory interface robot 638 is configured to transfer the substrates from the factory interface 604 to the processing platform 601 through the load lock chambers, such as 606A and 606B. Each of the load lock chambers 606A and 606B have a first port coupled to the factory interface 604 and a second port coupled to the transfer chamber 603A. The load lock chamber 606A and 606B are coupled to a pressure control system (not shown) which pumps down and vents the load lock chambers 606A and 606B to facilitate passing the substrates between the vacuum environment of the transfer chamber 603A and the substantially ambient (e.g., atmospheric) environment of the factory interface 604. The transfer chambers 603A, 603B have vacuum robots 642A, 642B disposed in the respective transfer chambers 603A, 603B. The vacuum robot 642A is capable of transferring substrates 621 between the load lock chamber 606A, 606B, the processing chambers 614A and 614F and a cooldown station 640 or a pre-clean station 642. The vacuum robot 642B is capable of transferring substrates 621 between the cooldown station 640 or pre-clean station 642 and the processing chambers 614B, 614C, 614D, and 614E.

In some embodiments, the processing chambers 614A, 614B, 614C, 614D, 614E, and 614F are coupled to the transfer chambers 603A, 603B. The processing chambers 614A, 614B, 614C, 614D, 614E, and 614F may comprise, for example, atomic layer deposition (ALD) process chambers, physical vapor deposition (PVD) process chambers, chemical vapor deposition (CVD) chambers, annealing chambers, or the like. The chambers may include any chambers suitable to perform all or portions of the methods described herein, as discussed above, such as a conformal layer ALD deposition chambers, non-conformal layer PVD deposition chambers, and gapfill material CVD deposition chambers, and the like. In some embodiments, one or more optional service chambers (shown as 616A and 616B) may be coupled to the transfer chamber 603A. The service chambers 616A and 616B may be configured to perform other substrate processes, such as degassing, orientation, substrate metrology, cool down, and the like.

The system controller 602 controls the operation of the tool 600 using a direct control of the process chambers 614A, 614B, 614C, 614D, 614E, and 614F or alternatively, by controlling the computers (or controllers) associated with the process chambers 614A, 614B, 614C, 614D, 614E, and 614F and the tool 600. In operation, the system controller 602 enables data collection and feedback from the respective chambers and systems to optimize performance of the tool 600. The system controller 602 generally includes a Central Processing Unit (CPU) 630, a memory 634, and a support circuit 632. The CPU 630 may be any form of a general-purpose computer processor that can be used in an industrial setting. The support circuit 632 is conventionally coupled to the CPU 630 and may comprise a cache, clock circuits, input/output subsystems, power supplies, and the like. Software routines, such as a method as described above may be stored in the memory 634 and, when executed by the CPU 630, transform the CPU 630 into a specific purpose computer (system controller) 602. The software routines may also be stored and/or executed by a second controller (not shown) that is located remotely from the tool 600.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for reducing resistivity of metal gapfill, comprising:
    depositing a conformal layer in an opening of a feature and on a field of a substrate, wherein a first thickness of the conformal layer is approximately 10 microns or less;
    depositing a non-conformal metal layer directly on the conformal layer at a bottom of the opening and directly on the field using an anisotropic deposition process, wherein a second thickness of the non-conformal metal layer on the field and on the bottom of the feature is approximately 30 microns or greater; and
    depositing a metal gapfill material in the opening of the feature and on the field, wherein the metal gapfill material completely fills the opening without any voids.

2. The method of claim 1, further comprising:
    depositing the conformal layer using an atomic layer deposition (ALD) process;
    depositing the non-conformal metal layer using a plasma vapor deposition (PVD) process; and
    depositing the metal gapfill material using a chemical vapor deposition (CVD) process.

3. The method of claim 1, wherein the first thickness is approximately 3 microns to approximately 8 microns.

4. The method of claim 1, wherein the second thickness is approximately 40 microns.

5. The method of claim 1, wherein the first thickness and the second thickness combined is at least approximately 40 microns.

6. The method of claim 1, wherein the conformal layer is titanium nitride, tungsten nitride, or tungsten carbon nitride.

7. The method of claim 1, wherein the non-conformal metal layer is tungsten or cobalt.

8. The method of claim 1, wherein the metal gapfill material is tungsten or cobalt.

9. The method of claim 1, wherein the feature is a contact for a logic device.

10. The method of claim 1, wherein the conformal layer is at least one monolayer in thickness.

11. The method of claim 1 performed in an integrated tool.

12. A method for reducing resistivity of metal gapfill, comprising:
    depositing a titanium nitride conformal layer in an opening of a feature and on a field of a substrate using an atomic layer deposition (ALD) process, wherein a first thickness of the titanium nitride conformal layer is approximately 10 microns or less;
    depositing a tungsten non-conformal layer directly on the titanium nitride conformal layer at a bottom of the opening and directly on the field using a plasma vapor deposition (PVD) process, wherein a second thickness of the tungsten non-conformal layer on the field and on the bottom of the feature is approximately 30 microns to approximately 50 microns; and
    depositing a tungsten gapfill material in the opening of the feature and on the field using a chemical vapor deposition (CVD) process, wherein the tungsten gapfill material completely fills the opening without any voids.

13. The method of claim 12, wherein the first thickness is approximately 3 microns to approximately 8 microns.

14. The method of claim 12, wherein the second thickness is approximately 40 microns.

15. The method of claim 12, wherein the first thickness and the second thickness combined is at least approximately 40 microns.

16. The method of claim 12, wherein the feature is a contact for a logic device.

17. The method of claim 12, wherein the titanium nitride conformal layer is at least one monolayer in thickness.

18. The method of claim 12 performed in an integrated tool.

19. A non-transitory, computer readable medium having instructions stored thereon that, when executed, cause a method for reducing resistivity of metal gapfill to be performed, the method comprising:
    depositing a conformal layer in an opening of a feature and on a field of a substrate, wherein a first thickness of the conformal layer is approximately 10 microns or less;
    depositing a non-conformal metal layer directly on the conformal layer at a bottom of the opening and directly on the field using an anisotropic deposition process, wherein a second thickness of the non-conformal metal layer on the field and on the bottom of the feature is approximately 30 microns to approximately 50 microns; and
    depositing a metal gapfill material in the opening of the feature and on the field, wherein the metal gapfill material completely fills the opening without any voids.

20. The non-transitory, computer readable medium of claim 19, the method further comprising:
    depositing the conformal layer using an atomic layer deposition (ALD) process;
    depositing the non-conformal metal layer using a plasma vapor deposition (PVD) process; and
    depositing the metal gapfill material using a chemical vapor deposition (CVD) process.

* * * * *